United States Patent
Yoshimatsu et al.

(10) Patent No.: US 7,982,374 B2
(45) Date of Patent: Jul. 19, 2011

(54) PIEZOELECTRIC VIBRATING PIECE WITH EXTENDED SUPPORTING ARMS

(75) Inventors: Masahiro Yoshimatsu, Saitama (JP); Hiroki Iwai, Saitama (JP)

(73) Assignee: Nihon Kempa Kogyo Co., Ltd., Tokyo (JP)

(*) Notice: Subject to any disclaimer, the term of this patent is extended or adjusted under 35 U.S.C. 154(b) by 322 days.

(21) Appl. No.: 12/332,160

(22) Filed: Dec. 10, 2008

(65) Prior Publication Data
US 2009/0167118 A1   Jul. 2, 2009

(30) Foreign Application Priority Data

Dec. 28, 2007 (JP) .................................. 2007-340411

(51) Int. Cl.
   *H01L 41/04*   (2006.01)
   *H03H 9/215*   (2006.01)
   *H03H 9/19*    (2006.01)
(52) U.S. Cl. ..................................................... 310/370
(58) Field of Classification Search .................. 310/370
   See application file for complete search history.

(56) References Cited

U.S. PATENT DOCUMENTS

| | | | |
|---|---|---|---|
| 7,015,631 B2* | 3/2006 | Hirasawa et al. | 310/370 |
| 7,067,966 B2* | 6/2006 | Tanaya | 310/367 |
| 7,205,708 B2* | 4/2007 | Yamada | 310/370 |
| 2006/0082261 A1 | 4/2006 | Tanaya | |

FOREIGN PATENT DOCUMENTS

| | | |
|---|---|---|
| JP | 2004-173218 | 6/2004 |
| JP | 2005-102138 | 4/2005 |
| JP | 2006-148857 | 6/2006 |

\* cited by examiner

*Primary Examiner* — J. SanMartin
(74) *Attorney, Agent, or Firm* — Klarquist Sparkman, LLP

(57) ABSTRACT

Piezoelectric vibrating pieces are disclosed made of a piezoelectric material to be mounted in a package. A representative piece includes a base formed of a piezoelectric material, having first and second ends, extending between the ends in a length direction, and having a designated width. The piece includes at least a pair of vibrating arms extending in the length direction from one end of the base, and a pair of supporting arms extending partially in a width direction from between the first and second ends of the base. The supporting arms further extend in the length direction outboard of the base and vibrating arms, and include an adhesive region at the tips of the supporting arms. The adhesive regions are used for mounting the piece to a package. Whereas the tips of the supporting arms do not extend beyond the tips of the vibrating arms, the axial length of supporting arms is greater than the length of the vibrating arms.

14 Claims, 8 Drawing Sheets

PIEZOELECTRIC VIBRATING PIECE WITH EXTENDED SUPPORTING ARMS

CROSS-REFERENCE TO RELATED APPLICATION

This application claims priority to and the benefit of Japan Patent Application No. 2007-340411, filed on Dec. 28, 2007, in the Japan Patent Office, the disclosure of which is incorporated herein by reference in its entirety.

FIELD

This disclosure pertains to, inter alia, methods for manufacturing tuning-fork type piezoelectric vibrating pieces having supporting arms, and to piezoelectric vibrating devices using piezoelectric substrates made of quartz crystal, for example.

DESCRIPTION OF THE RELATED ART

Various types of clocks, home electric appliances, and consumer electronics, and various types of commercial/industrial electrical apparatus such as information/communication devices and Office-Automation devices utilize at least one oscillator. These oscillators typically are manufactured by packaging a piezoelectric resonator, a piezoelectric vibrating piece, or an IC chip as a clock source for addition to and use by an electronic circuit of the apparatus. In other apparatus, piezoelectric timing devices such as real-time clock modules are widely used. Other uses for piezoelectric vibrating devices include in apparatus for navigation-control or attitude-control of ships, aircraft, and automobiles; angular-velocity sensors in image-stabilizers and other detectors used in video cameras and the like. Also, piezoelectric vibrating gyros are widely used in various devices including rotation-direction sensors used in, e.g., three-dimensional mouse devices.

Especially nowadays, such piezoelectric vibrating devices must be increasingly miniaturized and/or provided with a thinner or lower profile to be accommodated in electronic devices and packaging schemes that are correspondingly miniaturized and/or provided with a lower profile. Also, modern piezoelectric devices must be able to provide a low CI (crystal impedance) value, high quality, and stability. To minimize the CI value, tuning-fork type piezoelectric vibrating pieces have been developed. To miniaturize such pieces further, they have been configured with shorter base lengths and supporting arms.

U.S. Patent Publication No. US/2006/0082261A1 discusses a tuning-fork type piezoelectric vibrating piece 120 having supporting arms 140 extending to a base 129, wherein a pair of vibrating arms 121 extends from the base (see FIG. 7). Thus, the vibrating arms 121 are supported by the supporting arms 40. Each vibrating arm 121 includes a groove 127. The supporting arms 140 extend in the width direction from the base 129 and further extend in the direction in which the vibrating arms 121 extend. Providing the supporting arms 140 reduces adverse influences of changes in external temperature and/or of physical impacts from dropping the package PKG2. Thus, the temperature characteristics of the piece 120 are made favorable. Also, the supporting arms 140 substantially reduce leakage of oscillation from the vibrating arms 121, oscillating inside the package PKG2, to the exterior. The center of each supporting arm 140 is mounted to the package PKG2 at a connecting region 126 of the supporting arm, using electrically conductive adhesive CA.

However, as these piezoelectric vibrating pieces are further miniaturized, these conventional supporting arms and conventional locations of the connecting regions may no longer satisfactorily minimize influences of exterior temperature changes, physical impact, or leakage of oscillation from inside the package.

This disclosure provides piezoelectric vibrating pieces exhibiting reduced vibration leakage, without sacrificing physical robustness, by extending the axial length of the supporting arms, compared to conventionally, in a given package size. The subject piezoelectric vibrating devices meet further miniaturization requirements by affixing the tips of the supporting arms of the piezoelectric vibrating piece to the package.

SUMMARY

A first aspect of the disclosure pertains to piezoelectric vibrating pieces, of which an embodiment comprises a base, at least two vibrating arms, and a pair of supporting arms. The base is formed of a piezoelectric material, and extends from a first end thereof in a length direction to an opposing second end. The base has a width in a width direction. The at least two vibrating arms are also of the piezoelectric material, and extend in the length direction from the first end of the base. The vibrating arms have a designated length from the base to respective distal tips of the arms. The supporting arms, also desirably made of the piezoelectric material, also extend from the base, from locations between the first end and second end, in the width direction and then extend in the length direction outboard of respective vibrating arms. Each supporting arm has an "axial length." Each supporting arm includes a mounting tip having a respective connection region for connecting the mounting tip to a package. The mounting tips do not extend in the length direction past the distal tips of the vibrating arms. Nevertheless, the axial length of the supporting arms is greater than the length of the vibrating arms. Here, "axial length" means total length extending along a center-line in a cross-sectional view (in the length direction) of the supporting arm. If the center-line extends, e.g., mainly in the Y-direction but also has portions extending in the Z-direction, then the axial length is the total length of the Y-direction portions and of the Z-direction portions.

The piezoelectric vibrating piece is adapted for mounting to a package in which the piece can be sealed, such as in a vacuum environment. The supporting arms having this configuration prevent significant leakage of oscillation of the vibrating arms to the exterior of the package, and reduce the probability of the piece being adversely affected by exterior temperature changes or physical impact. The piezoelectric vibrating piece can be readily miniaturized without sacrificing performance.

In the piezoelectric vibrating piece each of the supporting arms, as extending in the length direction, desirably includes at least one "zig-zag." Zig-zags increase the axial length of the supporting arms. The zig-zags can be linear or curved. By way of example, the supporting arm can extend mainly in the length direction (e.g., Y-direction) and also in a direction (e.g., Z-direction) normal to the length and width directions (wherein the Z-direction is the thickness direction of the base). This zig-zag in the Y-direction and Z-direction can be defined by respective grooves in the X-Y surface of the supporting arms, wherein the grooves define respective bends of the supporting arms in the thickness (Z) direction. These grooves desirably have a depth, in the thickness direction, that is more than 50% of the thickness, in the thickness direction, of the supporting arms. Thus, the axial length of these supporting arms is longer than the length of the vibrating arms within the same installation area (X-Y plane) of a package used for housing a conventional piezoelectric vibrating piece. When the depth of the grooves (in the Z-direction) is less than 50% of the thickness (in the Z-direction) of the supporting arms, oscillation leakages transmit linearly down the supporting arms, which results in excessive oscillation leakage. Hence, the grooves desirably are more than 50% deeper than the thickness of the supporting arms.

In other embodiments the at least one zig-zag is in the length direction (e.g., Y-direction) and in the width direction (e.g., X-direction). For example, each zig-zag can be defined by respective bends of the supporting arms in the width direction. The bends can be 90° or less at sharp angles, radiused angles, or in a serpentine (e.g., sine wave) manner. Thus, again, the axial length of the supporting arms is greater than the length of the vibrating arms between the base and the tips of the vibrating arms. Nevertheless, the piezoelectric vibrating piece can be placed in a conventional package having the same height (e.g., Z-direction, same as thickness direction) as used for housing a conventional piezoelectric vibrating piece.

In yet another embodiment of a piezoelectric vibrating piece each of the supporting arms includes a first supporting-arm portion extending in a first direction of the length direction (e.g., Y-direction) and a second supporting-arm portion extending in a second direction, in the length direction, that is opposite the first direction. The first and second supporting-arm portions are connected end-to-end in a multi-deck manner that increases the axial length of the supporting arms. The end-to-end connection connects the first and second supporting-arm portions in, for example, a C-configuration.

According to another aspect, piezoelectric devices are provided. An embodiment thereof comprises a package and any of the piezoelectric vibrating pieces summarized above. The piezoelectric vibrating piece is situated in the package such that the tips of the supporting arms of the piezoelectric vibrating piece are affixed to the package. The piezoelectric device also includes a sealing cap sealing the piezoelectric vibrating piece inside the package. Such a piezoelectric device exhibits less oscillation leakage from the vibrating arms than conventional devices, and can sustain high performance without exhibiting significant change in oscillation frequency.

According to yet another aspect, methods are provided for manufacturing piezoelectric vibrating pieces that have vibrating arms made of a piezoelectric material and extending in a length direction from one end of a base, and supporting arms made of the piezoelectric material and extending at least partially in the length direction from respective sides of the base. The methods are particularly directed to a process for increasing the axial length of the supporting arms relative to the vibrating arms. An embodiment of such a process comprises a first piezoelectric-etching step in which at least a portion of an outline profile of the piezoelectric vibrating piece is defined, and in which at least a portion of the respective grooves in each of the supporting arms is defined. The process includes a second piezoelectric-etching step in which remaining portions of the outline profile, remaining portions of the grooves in the supporting arms, and respective grooves in each of the vibrating arms are defined. The grooves in the supporting arms serve to increase axial length of the supporting arms relative to the vibrating arms. In this process the grooves in the supporting arms, the outline profile of the piezoelectric vibrating piece, and the grooves in the vibrating arms can all be etched simultaneously, which reduces manufacturing costs.

In another embodiment of a method for manufacturing a piezoelectric vibrating piece, a process for increasing axial length of the supporting arms relative to the vibrating arms comprises performing a photolithographic etching process on a first piezoelectric material to form the base, vibrating arms, and first supporting-arm portions. A photolithographic etching process is also performed on a second piezoelectric material to form respective second supporting-arm portions. A respective piezoelectric block is formed for each of the supporting arms. The process includes siloxane-bonding respective ends of the first and second supporting-arm portions to the piezoelectric block to provide the supporting arms with a double-deck C-shaped configuration that extends axial length of the supporting arms relative to the vibrating arms.

According to yet another aspect, methods are provided for manufacturing a piezoelectric device. An embodiment of such a method comprises performing a first piezoelectric-etching step to define at least a portion of an outline profile of a piezoelectric vibrating piece, including base, supporting arms, and vibrating arms thereof, and to define at least a portion of respective grooves in each of the supporting arms. A second piezoelectric-etching step is also performed to define remaining portions of the outline profile, remaining portions of the grooves in the supporting arms, and respective grooves in each of the vibrating arms. The grooves in the supporting arms serve to increase axial length of the supporting arms relative to the vibrating arms. The vibrating arms extend in a length direction from one end of the base, and the supporting arms extend at least partially in the length direction from respective sides of the base. The respective tips of the supporting arms are mounted to a package, and the package is sealed, e.g., in a vacuum.

In the devices produced by this method, since the piezoelectric vibrating piece is affixed to the package at the tips of the supporting arms, oscillations from the vibrating arms are not significantly transmitted to the exterior of the package. Thus, high-performance piezoelectric devices are produced. Also, by extending the axial lengths of the supporting arms compared to corresponding lengths in conventional devices, piezoelectric vibrating devices having less oscillation leakage are provided. In addition, the longer axial lengths of the supporting arms reduce adverse influences from temperature changes outside the package and from physical impacts to the package. Oscillation leakage from inside the package is also inhibited.

DETAILED DESCRIPTION

This disclosure is set forth in the context of representative embodiments that are not intended to be limiting in any way.

Embodiment 1

Figure 1A:
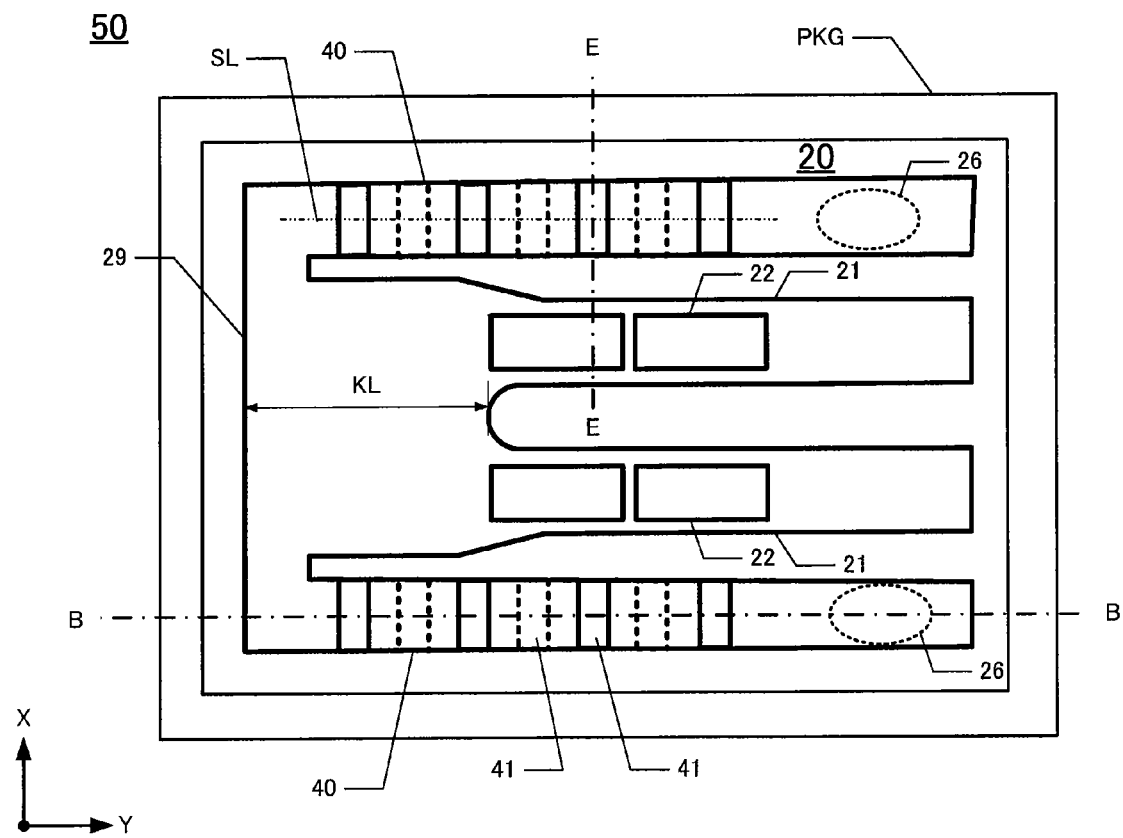
FIG. 1A is a top plan view of a piezoelectric device according to the first embodiment. The piezoelectric device includes a tuning-fork type crystal vibrating piece including supporting arms having grooves extending in the Z-direction and having a zig-zag configuration in the Y-Z plane.
Figure 1B:
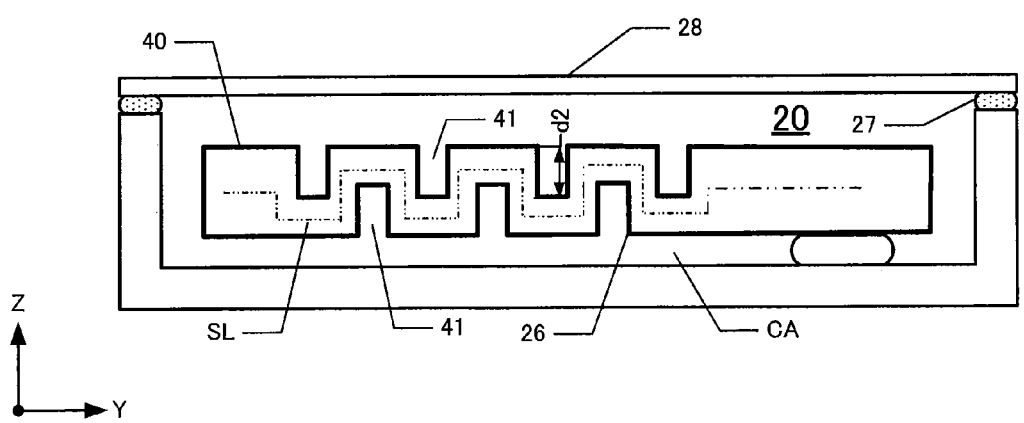
FIG. 1B is a cross-sectional view along the line B-B line of FIG. 1A.

First, the configuration of a tuning-fork type crystal vibrating piece 50, with supporting arms, of this embodiment is described with reference to FIGS. 1A and 1B. FIG. 1A is a top plan view of the tuning-fork type crystal vibrating piece 20 (herein termed a "supporting-arms type crystal vibrating piece" 20), which is contained in a package PKG. FIG. 1B is a cross-sectional view along the line B-B of one supporting arm 40 in FIG. 1A. The supporting-arm type crystal vibrating piece 20 includes vibrating arms 21 that extend in the Y-direction from the base 29. The supporting arms 40 also extend in the Y-direction after first extending from the base in the X-direction. The supporting arms 40 are connected, by electrically conductive adhesive CA, to respective electrodes (not shown) on the package PKG at a connection region 26 located substantially at the tips of the supporting arms.

The supporting-arm type crystal vibrating piece 20 is very small and oscillates at a frequency of, for example, 32.768 kHz. On both surfaces of each vibrating arm 21 is at least one first groove 22. FIG. 1A shows two first grooves 22 on the upper surface of each vibrating arm 21. Two similar first grooves 22 are also formed on the lower surface of each vibrating arm 21. Thus, each vibrating arm 21 in this embodiment has four first grooves 22. A section (in the X-Z plane) of a vibrating arm 21 through an opposing pair of first grooves 22 reveals a nearly H-shaped section of the arm (see figure to the right of step S120 in FIG. 3B). The first grooves 21 serve to control and minimize rises in the CI value.

The base 29 of the supporting-arm type crystal vibrating piece 20 is substantially board-shaped. The base has a length KL extending from a second end of the base 29 (left edge of the base in FIG. 1A) to an opposing first end of the base (from which the vibrating arms 21 extend). The length KL is desirably minimized to make the overall supporting-arm type crystal vibrating piece 20 shorter. However, simply reducing the base length KL may cause leakage of oscillation to the exterior of the package and may increase the risk of the piece being adversely affected by exterior temperature changes and by physical impacts. In this embodiment the base length KL is reduced by decreasing the distance over which the first supporting arms 40 extend in the longitudinal direction (Y-direction in the figure). But, the actual length of the first supporting arms 40 is not reduced as a result of adding length to them in dimensions other than the Y-direction.

In FIG. 1A the first supporting arms 40 initially extend outward in the X-direction (width direction) from the base near the second end of the base (generally between the first and second ends of the base). Then, the first supporting arms extend in the Y-direction, outboard of the base 29 and vibrating arms 21. Turning to FIG. 1B, the actual lengths of the first supporting arms 40 have been increased by forming second grooves 41 alternatingly on the upper and lower surfaces of the first supporting arms 21. The alternating placement of the second grooves 41 on the upper and lower surfaces results in the first supporting arms 40 having an up-down zig-zag shape in the Y-Z plane. Thus, the first supporting arms 40 are provided with additional length in the Z-direction. The second grooves 41 are formed by etching while the respective profiles of the supporting-arm type crystal vibrating piece 20 and the first grooves 22 are being formed concurrently. (The process for forming the second grooves 41 will be explained later below.) Normally, if the first supporting arms 40 are simply made longer than the vibrating arms 21 by simply extending them in the Y-direction, the package PKG1 would need to be made correspondingly longer, which is not desired. Hence, in this embodiment, while maintaining the distance over which the first supporting arms 40 extend in the Y-direction not exceeding the length of the vibrating arms 21, the actual length of the first supporting arms is extended by the added Z-direction lengths. Consequently, the first supporting arms 40 are actually longer than their Y-direction length as a result of the second grooves 41 providing each first supporting arm 40 with added length in the Z-direction. The actual length of the first supporting arms 40 is now greater than the length of the vibrating arms 21 without having to use a longer package.

More specifically, in the zig-zag profile (FIG. 1B), the depth d2 of the second grooves 41 is more than 50% of the thickness (in the Z-direction) of the first supporting arms 40. This makes the actual length SL (called "axial length"), which repeatedly passes through the center-line of the depicted cross-section, of the first supporting arms 40 longer than the length of the vibrating arms 21. Hence, the distance over which oscillations may be transmitted along the first supporting arms 40 is increased, which reduces such transmission. The oscillation-transmission is also reduced efficiently by repetitive reflection and damping of oscillations at the second grooves 41. Therefore, the first supporting arms 40 including the second grooves 41 substantially reduce leakage of oscillations of the vibrating arms 21 to the exterior of the package PKG. This configuration of the first supporting arms 40 also reduces the probability of piezoelectric vibrating piece 20 being adversely affected by external temperature changes or physical impacts.

It is desirable that the depth d2 of the second grooves 41 not be less than 50% of the thickness of the first supporting arms 40. This is because oscillation leakage transmits linearly. Concerning the strength of the first supporting arms 40, the depth d2 of the second grooves 41 desirably is greater than 50% and less than or equal to 70% of the thickness of the first supporting arms 40.

Figure 7:
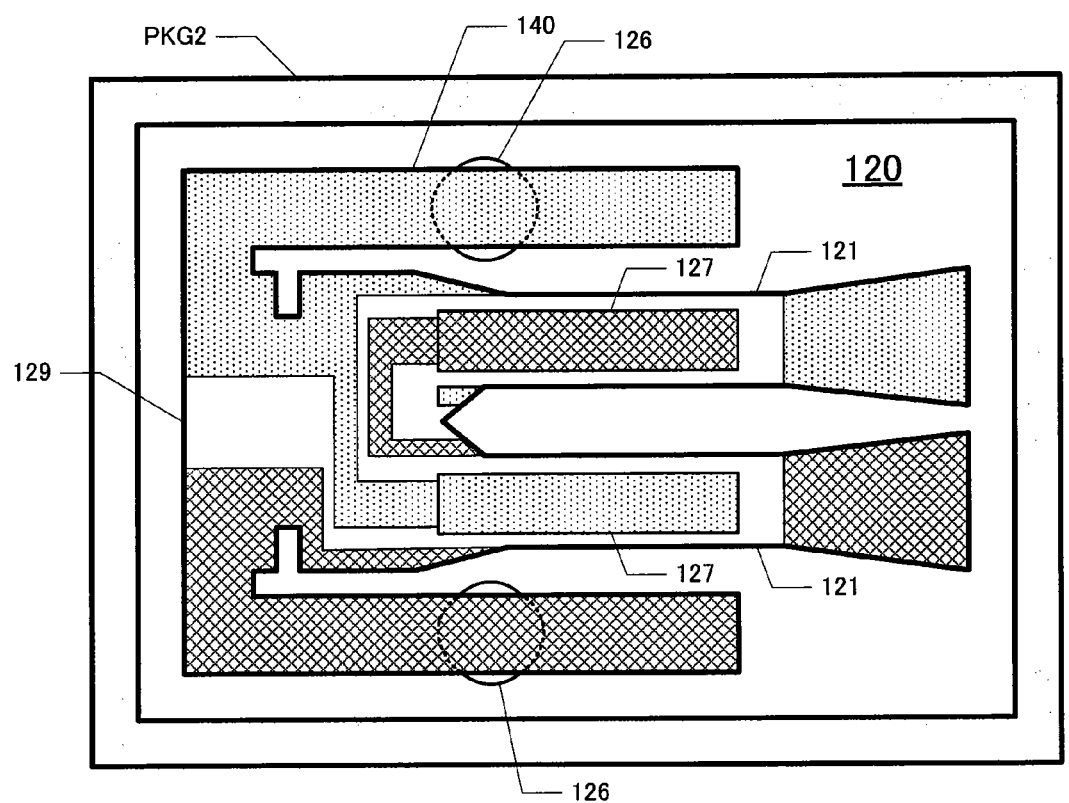
FIG. 7 is a plan view of a conventional supporting-arm type crystal vibrating piece.

The first supporting arms 40 are connected to the package PKG at the connection regions 26 by electrically conductive adhesive CA. In this embodiment the connection regions 26 are located at the tips of the first supporting arms 40, rather than at approximately mid-length (FIG. 7). In Embodiments 2, 3, and 4 (discussed later below), the supporting arms are connected in a similar manner, namely at the tips, using electrically conductive adhesive CA.

Figure 2:
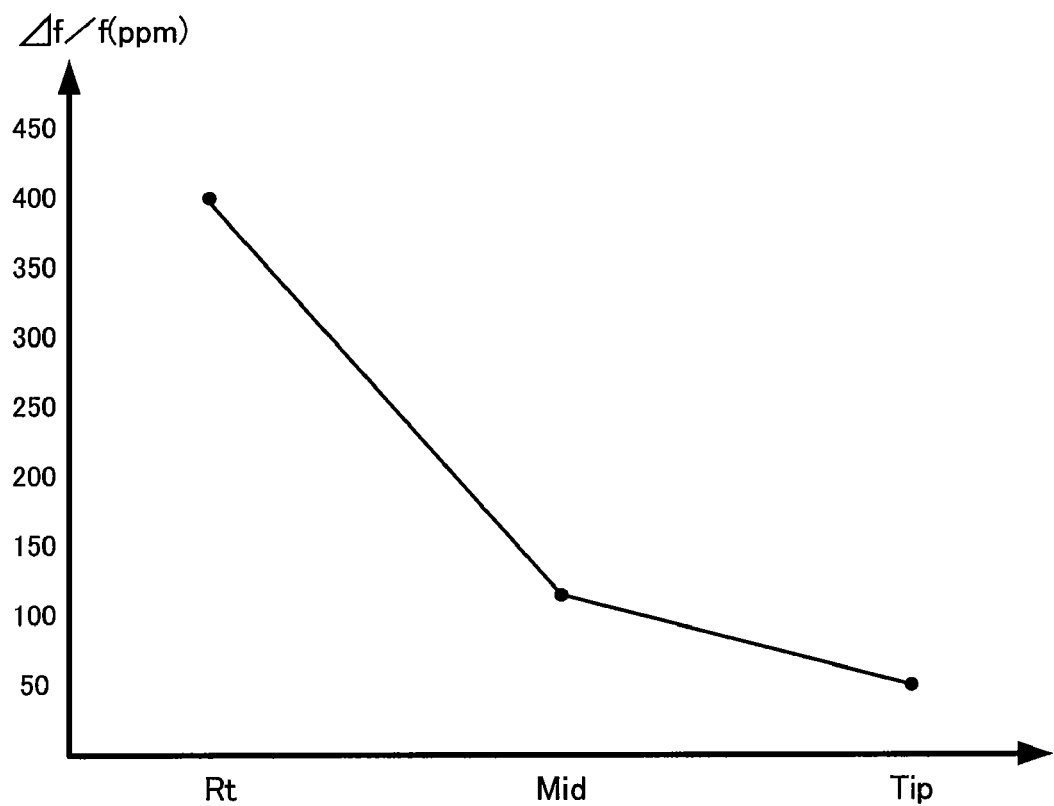
FIG. 2 is a graph of simulation data concerning frequency change exhibited by vibrating arms extending from supporting arms mounted at different locations on the supporting arms.

FIG. 2 is a plot of data, obtained by simulation, of change in vibration frequency exhibited by a supporting-arm type crystal vibrating piece 20 with different positions of the connection regions 26 along the first supporting arms 40. The vibrating arms 21 lacked first grooves in this simulation. Positioning the connecting portion 26 at the tips ("Tip") of the first supporting arms 40 substantially reduces frequency changes ($\Delta f/f$). As understood from the graph, a small change of frequency indicates that oscillation leakage is favorably suppressed. FIG. 2 also shows data obtained when the first supporting arms 40 are fixed at their "roots" at the base 29 (denoted by "Rt") and data obtained when the first supporting arms are fixed at mid-length ("Mid"). As understood from this graph, vibration frequency is more stable when the supporting arms 40 are fixed at their tips. By locating the connection regions 26 at the tips of the first supporting arms 40 and by making the axial lengths SL of the first supporting arms longer, changes in vibration frequency of the vibrating arms are favorably suppressed. The supporting-arm type crystal vibrating piece 20 is fixed to the package PKG at the connection regions 26 by the electrically conductive adhesive CA.

Therefore, positioning the connecting regions 26 at the tips of the first supporting arms 40 reduces the probability and magnitude of vibration-frequency changes ($\Delta f/f$). Whenever the change in vibration frequency is small, the oscillation leakage is correspondingly suppressed. Thus, increasing the axial lengths of the first supporting arms 40 suppresses oscillation leakage.

Method for Manufacturing Piezoelectric Device

A piezoelectric device 50 basically comprises the supporting-arm type crystal vibrating piece 20 contained inside the package PKG. Discussed below is a flow-chart (FIGS. 3A-3B) of an embodiment of a method for manufacturing the supporting-arm type crystal vibrating piece 20, as well as the piezoelectric device 50.

Figure 3A:
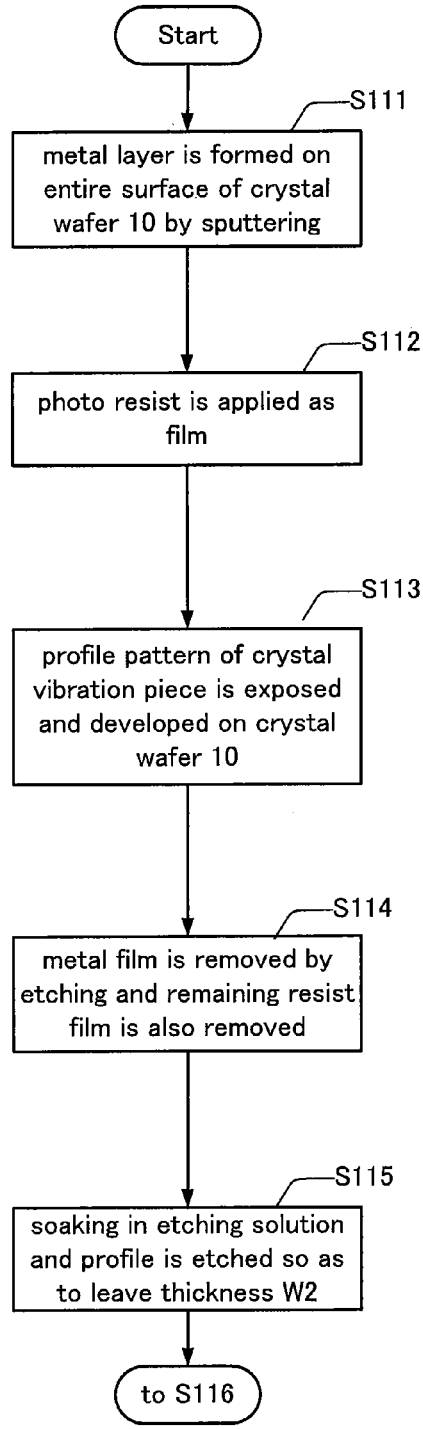
FIGS. 3A and 3B are a flow-chart of an embodiment of a method for manufacturing a supporting-arm type crystal vibrating piece 20.
Figure 3A:
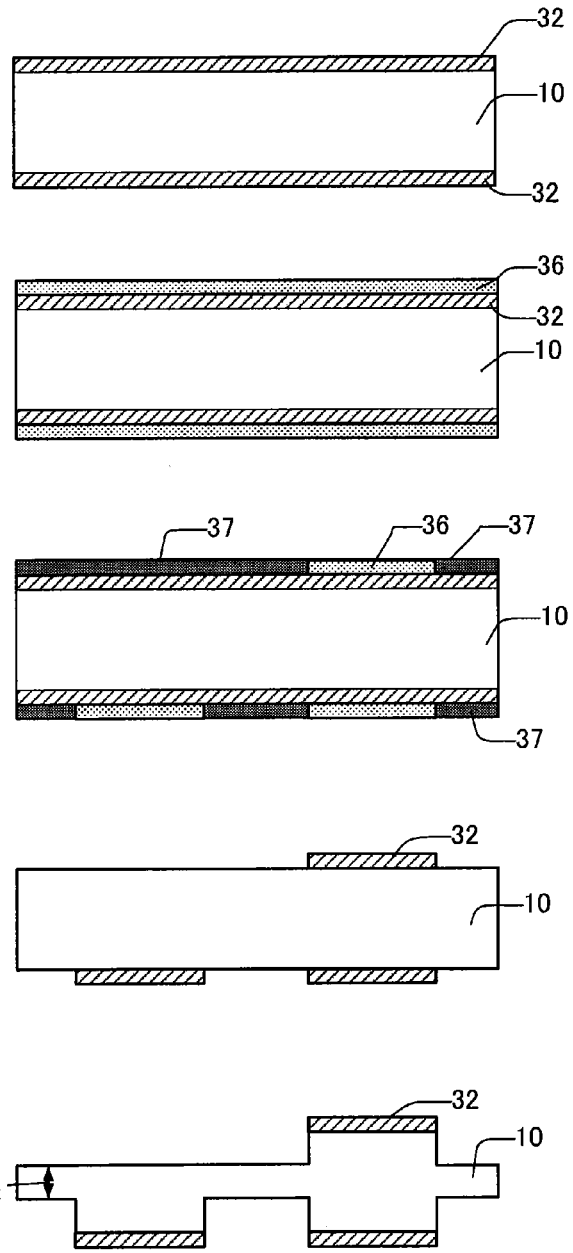
Figure 3B:
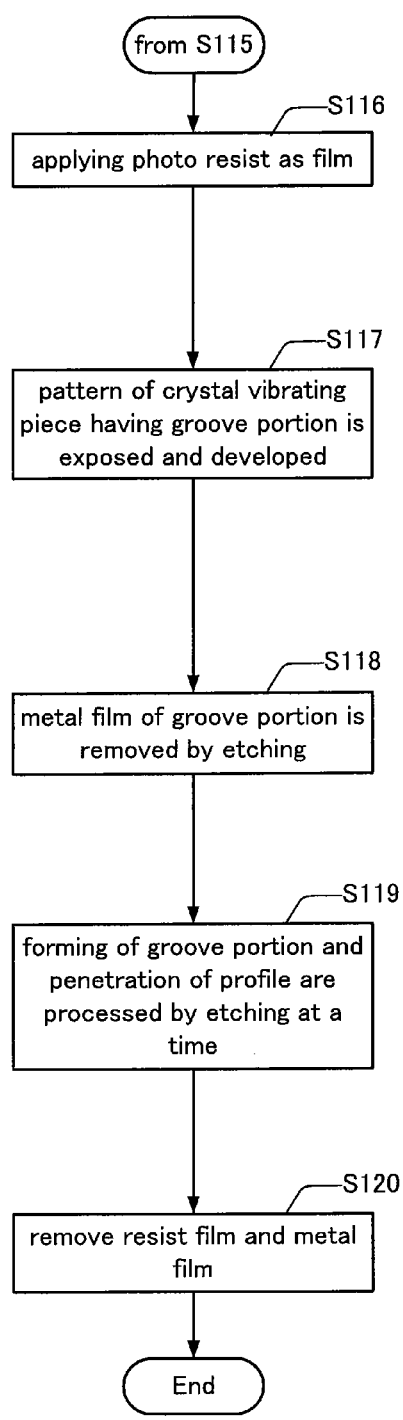
Figure 3B:
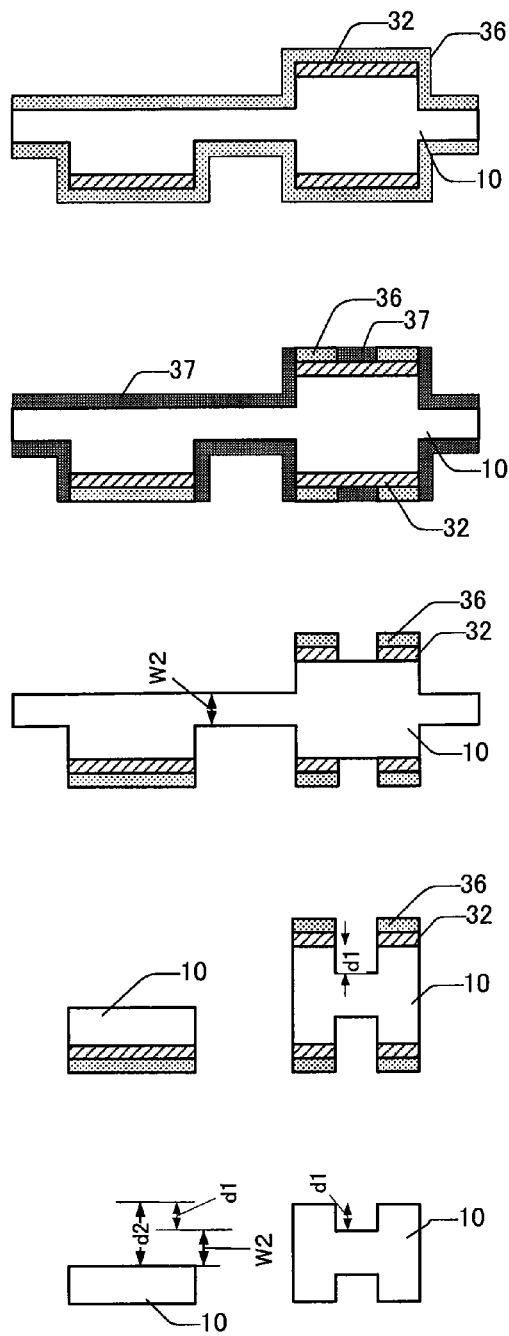

In FIGS. 3A and 3B the manufacturing method involves photolithographic etching. Figures on the right of each step in the flow chart of FIGS. 3A and 3B depict respective cross-sections of the crystal wafer 10 along the line E-E in FIG. 1A, illustrating the results of the respective steps. In the figures, the second groove 41 is formed on the left and the first groove 22 is formed on the right. It will be understood that utilizing photolithographic etching techniques in the subject method is exemplary and not intended to be limiting.

In step S111 of FIG. 3A, a single-crystal wafer 10 is prepared, and a metal film 32 is formed on both surfaces of the single-crystal wafer 10 by vacuum deposition or sputtering. The metal film 32 serves as a corrosion-resistant film, and desirably includes a layer of silver or gold. Since it is difficult to form gold (Au) or silver (Ag) directly on the wafer surface, a layer of chromium (Cr), nickel (Ni), or titanium (Ti) is applied first as a base coat, followed by forming the silver or gold layer. Thus, in this embodiment, the metal film 32 comprises a layer of silver or gold on a chromium layer. By way of example, the thickness of the chrome layer is 100 Ångstroms and of gold layer is 1000 Ångstroms. The figure on the right of step S111 shows the result.

In step S112 a layer 36 of photoresist layer is applied evenly on both metal-film surfaces by spin coating. The photoresist layer 36 can be of a positive photoresist comprising novolak resin. The result of this step is shown to the right of step S112.

In step S113 a photolithographic exposure tool is used to form the outline profile of the supporting-arm type crystal vibrating piece 20. Specifically, the profile outline, as defined on a photo-mask, is exposed using the photolithography tool on the photoresist layer 36 on both sides of the single-crystal wafer 10. As the figure to the right of step S113 shows, the exposed photoresist 37 defines areas from which the metal layer 32 is to be removed on the upper and lower surfaces of the single-crystal wafer 10. The exposed lower surface defines the width of first supporting arm 40. The figure to the right of step S113 shows the exposed photoresist layer 37, which is removed by a "development" step.

In step S114 portions of the gold layer now revealed by removal of the exposed photoresist 37 are etched using an aqueous solution of iodine and potassium iodide. Then, portions of the underlying chrome layer revealed by removing corresponding portions of the gold layer are etched using, for example, an aqueous solution of ceric ammonium nitrate and acetic acid. The concentrations of these etchants, etching temperature, and etching time are controlled to avoid over-etch, while nevertheless denuding the exposed regions down to the underlying single-crystal material 10. Then, remaining photoresist layer 36 is removed, as shown to the right of step S114.

In step S115 regions of the single-crystal wafer 10 from which the metal layer 32 has been etched away provide an outline profile of the supporting-arm type crystal vibrating piece 21. These regions are wet-etched while controlling etching time to prevent etching completely through the crystal wafer 10. Rather, a thickness W2 is left, as shown in the figure to the right of step S115.

The thickness W2 is controlled to be less than or equal to a depth d1 that is the depth of the groove shown in the figure to the right of step S119. The depth d2 of the second groove 41 of the first supporting arm 40 is a sum of the thickness W2 and the depth d1 so that the thickness W2 can be determined based on a desired depth. Also, by configuring the depth d2 of the second groove 41 to be more than 50% of the thickness of the first supporting arms, the length in the axial direction of the first supporting arms is correspondingly increased. This step is termed a "first piezoelectric etching" step.

In step S116 of FIG. 3B, new photoresist 36 is applied, by spin coating or spraying, onto both surfaces of the wafer. The result is shown in the figure to the right of step S116.

In step S117 the outline profile of the supporting-arm type crystal vibrating piece 20 and the first grooves 22, as defined on a photo-mask are exposed onto the photoresist layer 36 using a photolithographic exposure tool. The figure to the right of step S117 shows regions of exposed photoresist 37 and non-exposed photoresist 36. The exposed photoresist 37 is developed and removed.

In step S118 regions of the metal layer 32 (defining the first grooves 22) revealed by removing the exposed photoresist 37 are removed by etching. In this case, the revealed portions of the metal layer 32 are removed by the same etching technique used in step S114. The figure to the right of step S118 shows the result of removing the revealed regions of the metal layer 32.

In step S119 wet etching is performed to form the first grooves 22, the second grooves 41, and the outline profile in regions denuded by removing the exposed photoresist. Hydrofluoric acid solution is used as the etching solution. The first grooves 22 and profile are formed simultaneously on the crystal wafer 10. As the figure to the right of step S119 shows, wet etching is performed within a defined time to form the first groove portions 22 with a specified depth d1. In previously wet-etched regions, the current wet-etch penetrates the remaining thickness of the wafer to define the profile. Full-depth wet-etch is assured because W2≦d1. The second grooves 41 are formed with a specified depth d2. This step is termed the "second piezoelectric etching step."

In step S120, remaining photoresist 36 and metal layer 32 are removed. Upon completion of this step, the supporting-arm type crystal vibrating piece 20 having first grooves 22 and second grooves 41 is formed on the single-crystal wafer 10. The result is shown in the figure to the right of step S120.

In the foregoing process, the supporting-arm type crystal vibrating piece 20 is formed, wherein the first grooves 22 and second grooves 41 are formed in the first piezoelectric etching step in step S117 and the second piezoelectric etching step in step S119, respectively.

On the vibrating arms 21, the base 29, and the first supporting arms 40, excitation electrodes and connecting electrodes are formed after the profiles of the supporting-arm type crystal vibrating piece 20 and grooves are formed. Electrodes are not shown in FIGS. 1A-1B for ease of comprehension of what is shown.

Electrodes are typically formed as respective 100-5000 Ångstroms thick layers of gold (Au) on 50-5000 Ångstroms of chromium (Cr). That is, the total thickness of the first and second layer of the electrodes is 150-10,000 Ångstroms, constituting the thickness of the electrodes. Instead of forming the first electrode layer of chromium, tungsten (W), nickel (Ni), nickel-tungsten, or titanium (Ti) layer can be used. Instead of forming the second electrode layer of gold, silver (Ag) can be used. Further alternatively, the electrodes can be formed as single layers, such as a single layer of aluminum (Al), copper (Cu), or silicon (Si), for example.

Formation of electrodes, such as excitation electrodes, typically involves photolithographic exposure of resist, and etching, which are commonly known. Upon forming the excitation and other electrodes, manufacture of the supporting-arm type crystal vibrating piece 20 is completed. The supporting-arm type crystal vibrating piece 20 is mounted in the package PKG by adhesive bonding at the connection regions near the tips of the first supporting arms 40. For example, the tips of the first supporting arms 40 are mounted on the electrically conductive adhesive CA previously applied to connection electrodes (not shown) on the package PKG. The electrically conductive adhesive CA is cured by heat. The electrically conductive adhesive CA is fully hardened in a hardening furnace, which bonds the connecting regions 26 of the supporting-arm type crystal vibrating piece 20 to the package PKG.

Then a tuning step is performed in which a beam of laser light is irradiated onto regions near the tips of the vibrating arms 21 of the supporting-arm type crystal vibrating piece 20. In a previous step a metal layer was formed on the surfaces near the tips of the vibrating arms 21 to serve as "weights." Exposure of selected regions of the weights to the laser beam results in vaporization and sublimation of the metal in the regions. Thus, adjustment of the vibrating frequency of the vibrating arms is achieved by mass reduction. Next, the package PKG, to which the supporting-arm type crystal vibrating piece 20 has been mounted and connected, is moved to a vacuum chamber in which a lid 28 is bonded, using a sealant 27, to the package. Thus, manufacture of the piezoelectric vibrating device 50 is completed. Finally, performance of the piezoelectric vibrating device 50 is tested and confirmed. Devices passing the performance step represent completed piezoelectric vibrating devices 50.

Embodiment 2

In Embodiment 1, the axial length SL of the first supporting arms 40 was increased by forming second grooves 41, extending in the Z-direction, in the first supporting arms 40. To minimize significant compromises in strength of the first supporting arms due to the grooves, the X-direction width of the first supporting arms 40 can be increased. Alternatively, for example, the supporting arms can be configured according to this second embodiment.

Figure 4A:
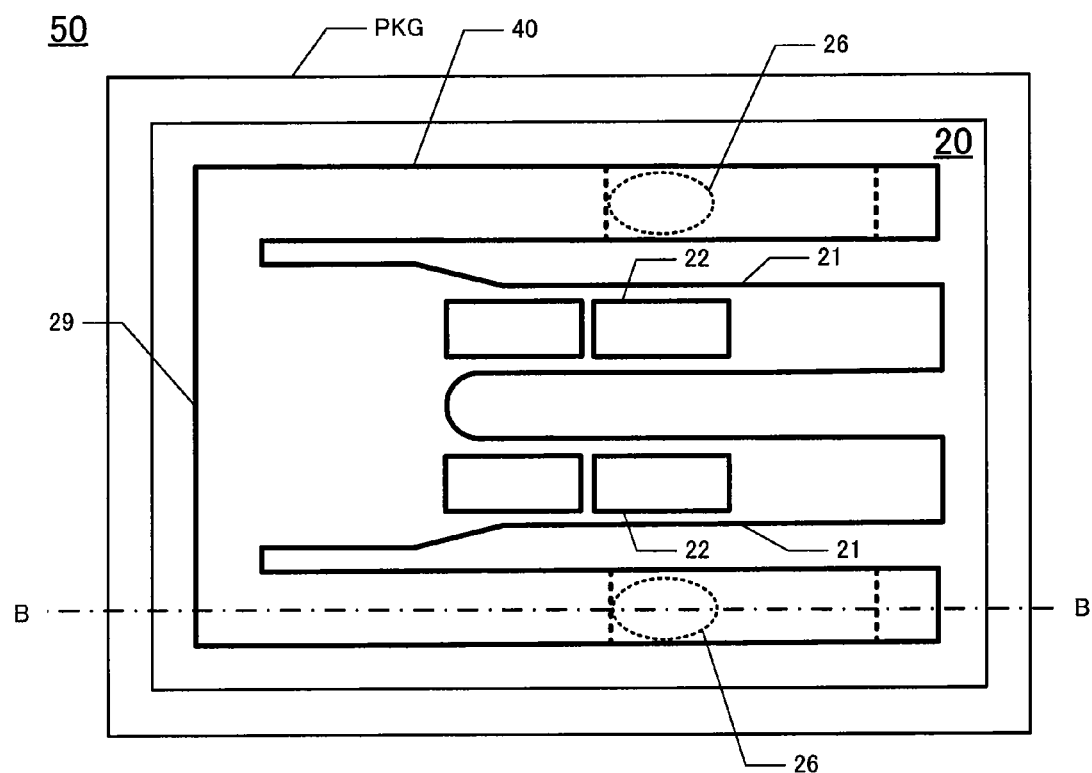
FIG. 4A is a top plan view of a piezoelectric device according to the second embodiment. The piezoelectric device includes a tuning-fork type crystal vibrating piece of which the supporting arms have a reverse C-shape configuration in the Z-direction.
Figure 4B:
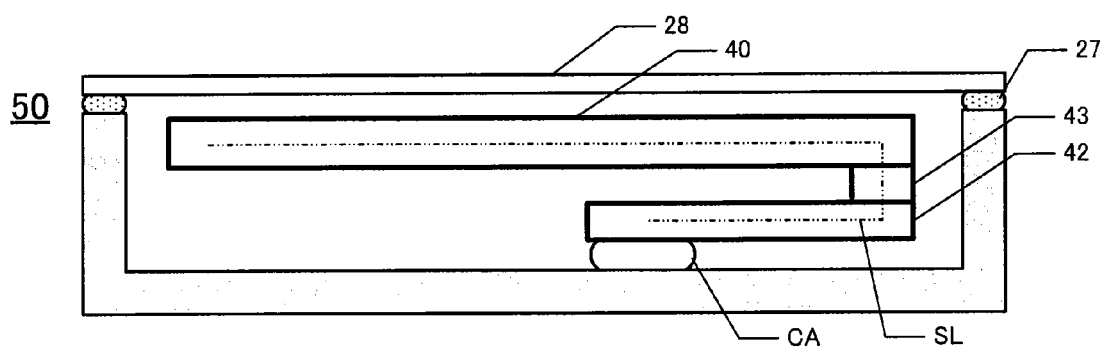
FIG. 4B is a cross-sectional view along the line B-B in FIG. 4A.

FIG. 4A is a top plan view showing the configuration of a piezoelectric device in which the supporting arms have a C-shape in the Y-Z plane. FIG. 4B is a cross-sectional view along the line B-B line in FIG. 4A, showing the C-shaped cross-section. In FIG. 4A the first supporting arms 40 and the second supporting arms 42 have a double-deck configuration in the Z-direction, which increases the axial length of the first supporting arms 40 without having to increase the length of the package PKG. The double-deck supporting-arm type crystal vibrating piece 20 is affixed to the package PKG at the tips of the second supporting arms 42. Additionally, oscillations from the vibrating arms 21 are reflected and attenuated at the connection of the first supporting arms 40 to the second supporting arms 42 so that the oscillation leakage decreases efficiently along the supporting arms. The supporting-arm type crystal vibrating piece 20 of this embodiment needs slightly more space in the Z-direction in the package PKG for accommodating the double-deck supporting arms.

A method for manufacturing the supporting-arm type crystal vibrating piece of this embodiment includes forming an outline profile of the crystal vibrating piece 20 having the first supporting arms 40 by a conventional photo-resist etching step. The second supporting arms 42 (with the crystal block 43 used for connecting the first and second supporting arms) are separately manufactured by a conventional photo-resist etching step. Then, the first supporting arms 40 are connected to the crystal blocks 43 of the second supporting arms 42 by siloxane (Si—O—Si) bonding. Siloxane bonding can be achieved by, for example, mirror-polishing the connecting surfaces of the crystal block 43 and first supporting arms 40, bringing the polished surfaces into contact with each other, and heating to a designated temperature to bond together the first supporting arms 40, the crystal block 43, and the second supporting arms 42. Since the siloxane bond is of the crystal materials themselves, concern over possible deformation due to thermal expansion is alleviated. The resulting supporting-arm type crystal vibrating piece 20 is stable with respect to thermal effects and changes in vibration frequency.

Embodiment 3

Figure 5A:
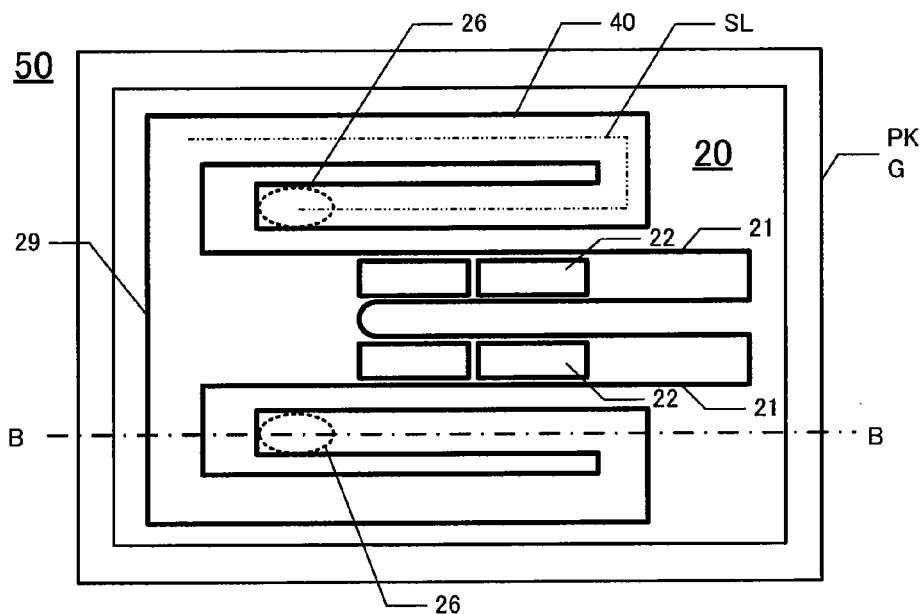
FIG. 5A is a top plan view of a piezoelectric device according to the third embodiment. The piezoelectric device includes a tuning-fork type crystal vibrating piece of which the supporting arms are laterally bent inwardly toward the base and vibrating arms.
Figure 5B:
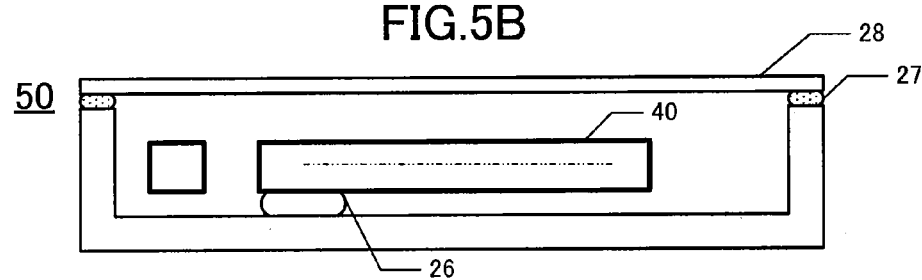
FIG. 5B is a cross-sectional view along the line B-B in FIG. 5A.
Figure 5C:
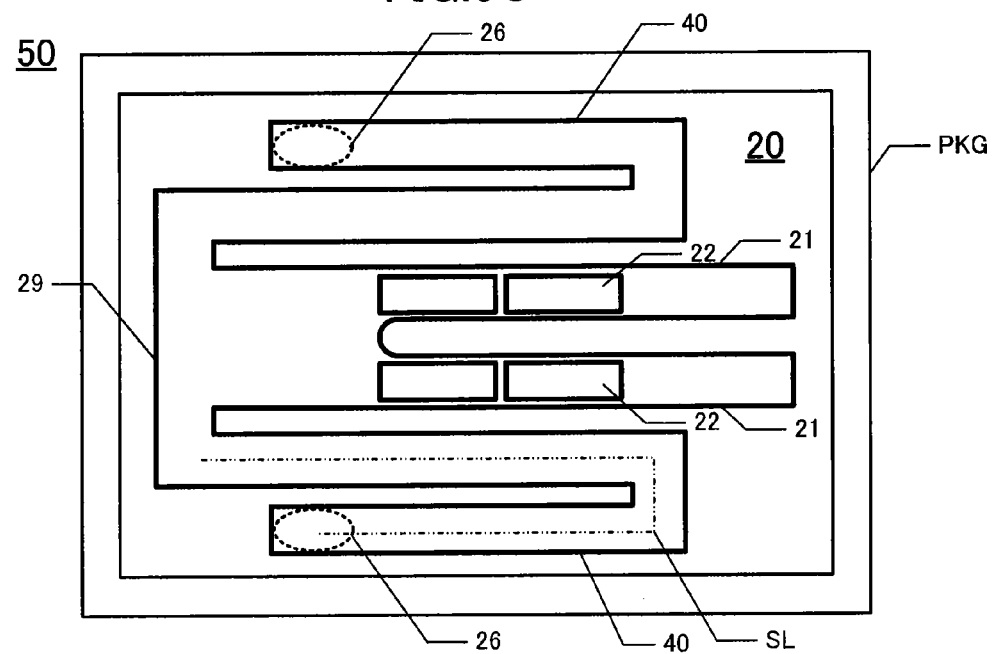
FIG. 5C is a top plan view of a piezoelectric device according to an alternative configuration of the third embodiment. The piezoelectric device includes a tuning-fork type crystal vibrating piece of which the supporting arms are laterally bent outwardly away from the base and vibrating arms.

FIG. 5A is a top plan view showing the configuration of a piezoelectric device of which the supporting arms are bent medially inwardly. FIG. 5B is a cross-sectional view along the line B-B in FIG. 5A. FIG. 5C is a top plan view showing the configuration of a piezoelectric device of which the supporting arms are bent outwardly, which is opposite to the bends shown in FIG. 5A.

In this embodiment the supporting arms 40 of the supporting-arm type crystal vibrating piece 20 in a piezoelectric device 50 are bent medially around near the tips of the vibrating arms 21 and thus connected to the package PKG. The first supporting arms 40 extend from the base 29 in the same direction (Y-direction) as the vibrating arms 21. The supporting arms curve around medially in the X-direction, inwardly toward the tips of the vibrating arms 21, and further extend in the opposite Y-direction along the base 29. This configuration extends the axial length SL of the first supporting arms 40. FIG. 5B is a cross-sectional view along the line B-B in FIG. 5A.

FIG. 5C shows an alternative configuration in which the first supporting arms 40 extend from the base 29 in the same direction (Y-direction) as the vibrating arms 21. The supporting arms curve around in the X-direction, outwardly from the tips of the vibrating arms 21, and further extend in the opposite Y-direction outboard of the base 29. Since oscillations experience reflection and damping at the bends in the first supporting arms 40, oscillation decreases efficiently along the supporting arms.

The first supporting arms 40 of this embodiment can be formed by a conventional photolithography-resist-etching method. Forming the supporting-arm type crystal vibrating piece 20 includes formation of electrodes. The electrodes are connected to the package PKG at the tips of the first supporting arms 40 to form a piezoelectric device. In an alternative configuration the second grooves 41 described in Embodiment 1 can be formed on the first supporting arms 40.

Embodiment 4

Figure 6A:
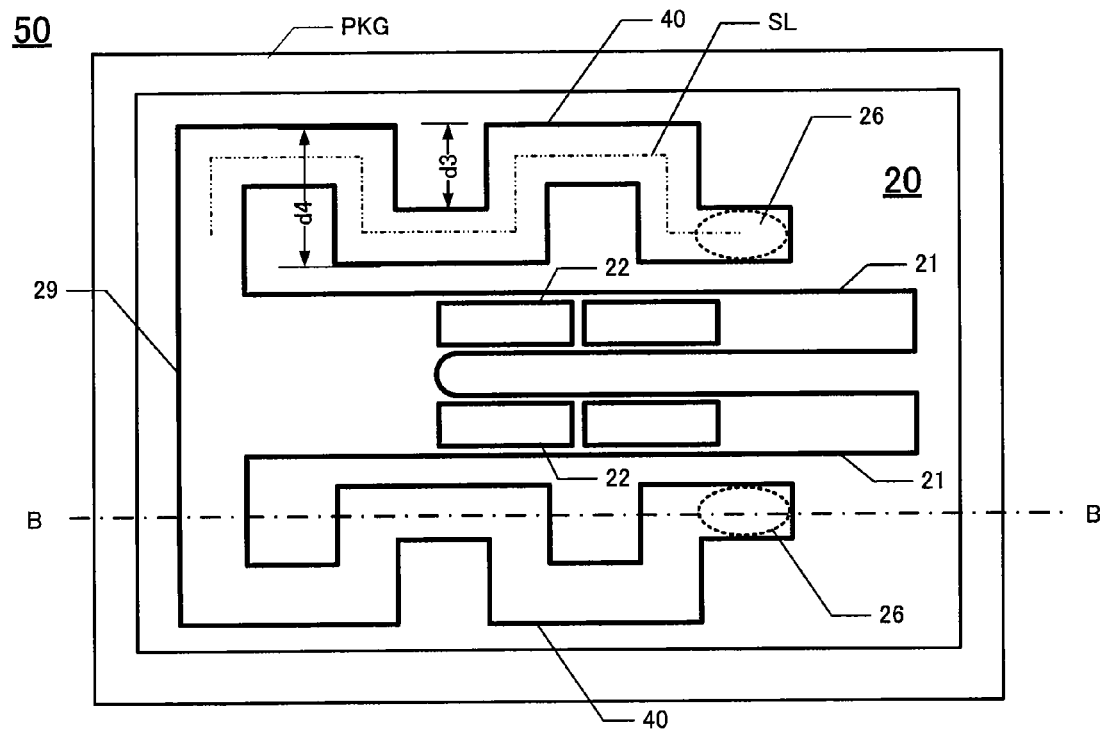
FIG. 6A is a top plan view of a piezoelectric device according to the fourth embodiment. The piezoelectric device includes a tuning-fork type crystal vibrating piece of which the supporting arms have a zig-zag configuration in the X-Y plane.
Figure 6B:
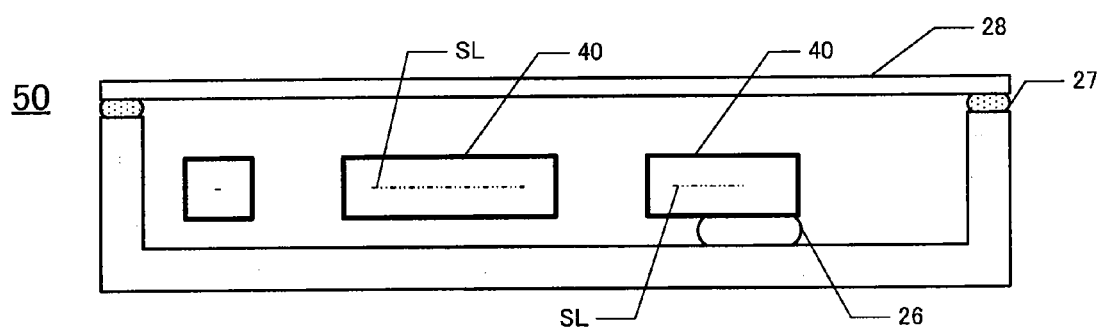
FIG. 6B is a cross-sectional view along the line B-B in FIG. 6A.

FIGS. 6A-6B depict a supporting-arm type crystal vibrating piece 20 of this embodiment, in which the first supporting arms 40 have a zig-zag profile as viewed in the plan view of FIG. 6A. The supporting arms 41 extend from the base 29 in the width direction (X-direction), then extend in the direction (Y-direction) of the vibrating arms 20, and then continue with a zig-zag conformation. This conformation increases the axial length SL of the first supporting arms in the limited size of the package PKG. Additionally, oscillations experience reflection and damping at the bends in the first supporting arms 40 so that the oscillation decreases efficiently along the supporting arms.

The depth d3 of the concave portion of the first supporting arms 40 desirably is 50% greater than the full width d4 of the first supporting arm 40. Thus, the axial length SL is further increased, which correspondingly increases the distance over which oscillations may be transmitted.

The first supporting arms 40 having a zig-zag conformation, according to this embodiment, can be formed as a profile in the supporting-arm type crystal vibrating piece 20 by a conventional photolithography-resist-etching method. A piezoelectric device is completed when the supporting-arm type crystal vibrating piece 20, including electrodes, is connected at the tips of the first supporting arms to the package PKG.

Whereas the zig-zag configuration of this embodiment involves 90° bends in the first supporting arms, the angle need not be 90°. In alternative configurations, the zig-zags involve, for example, 60°. In other alternative configurations, the zig-zag is serpentine (e.g., sine wave) when viewed in plan view. In other words, various zig-zag profiles can be used if they increase the axial length SL of the first supporting arms 40 to greater than the length of the vibrating arms 21.

Representative embodiments are described above. It will be understood that these embodiments can be modified or changed while not departing from the spirit and scope of them and/or of the appended claims. For example, besides quartz crystal, lithium niobate or other piezoelectric material can be used as the crystal wafer.

What is claimed is:

1. A piezoelectric vibrating piece, comprising:
a base formed of a piezoelectric material, the base extending from a first end thereof in a length direction to an opposing second end and having a width in a width direction;
at least two vibrating arms of the piezoelectric material extending in the length direction from the first end of the base, the vibrating arms having a designated length from the base to respective distal tips of the arms;
a pair of supporting arms extending from the base, from a location between the first end and second end, in the width direction and then extending in the length direction outboard of respective vibrating arms, each supporting arm having an axial length; and
each supporting arm including a mounting tip having a respective connection region for connecting the mounting tip to a package, wherein the mounting tips do not extend in the length direction past the distal tips of the vibrating arms, and the axial length of the supporting arms is greater than the length of the vibrating arms.

2. The piezoelectric vibrating piece of claim 1, wherein each of the supporting arms, as extending in the length direction, includes at least one zig-zag that increases the axial length of the supporting arms.

3. The piezoelectric vibrating piece of claim 2, wherein the at least one zig-zag is in the length direction and in a thickness direction of the base, the thickness direction being normal to the length and width directions.

4. The piezoelectric vibrating piece of claim 3, wherein the at least one zig-zag is defined by respective grooves in a surface of the supporting arms, the grooves defining respective bends of the supporting arms in the thickness direction.

5. The piezoelectric vibrating piece of claim 4, wherein the grooves have depth, in the thickness direction, that is more than 50% of a thickness, in the thickness direction, of the supporting arms.

6. The piezoelectric vibrating piece of claim 2, wherein the at least one zig-zag is in the length direction and in the width direction.

7. The piezoelectric vibrating piece of claim 6, wherein each zig-zag is defined by respective bends of the supporting arms in the width direction.

8. The piezoelectric vibrating piece of claim 7, wherein the bends have a dimension, in the width direction, that is more than 50% of a total width, in the width direction, of the supporting arms.

9. The piezoelectric vibrating piece of claim 7, wherein each supporting arm further comprises at least one additional zig-zag in the length direction and in a thickness direction of the base.

10. The piezoelectric vibrating piece of claim 9, wherein the at least one additional zig-zag is defined by respective grooves in a surface of the supporting arms, the grooves defining respective bends of the supporting arms in the thickness direction.

11. The piezoelectric vibrating piece of claim 10, wherein the grooves have a depth, in the thickness direction, that is more than 50% of a thickness, in the thickness direction, of the supporting arms.

12. The piezoelectric vibrating piece of claim 1, wherein:
each of the supporting arms includes a first supporting-arm portion extending in a first direction of the length direction and a second supporting-arm portion extending in a second direction, in the length direction, that is opposite the first direction; and
the first and second supporting-arm portions are connected end-to-end in a multi-deck manner that increases the axial length of the supporting arms.

13. The piezoelectric vibrating piece of claim 12, wherein the end-to-end connection connects the first and second supporting-arm portions in a C-configuration.

14. A piezoelectric device comprising:
a package;
a piezoelectric vibrating piece, according to claim 1, situated in the package such that the tips of the supporting arms of the piezoelectric vibrating piece are affixed to the package; and
a sealing cap sealing the piezoelectric vibrating piece inside the package.

* * * * *